US011156665B2

(12) United States Patent
Rich et al.

(10) Patent No.: US 11,156,665 B2
(45) Date of Patent: Oct. 26, 2021

(54) VERIFYING OPERATION OF BATTERY CONTACTORS DURING VEHICLE OPERATION WITHOUT LOSS OF POWER

(71) Applicant: GM Global Technology Operations LLC, Detroit, MI (US)

(72) Inventors: Dave G. Rich, Sterling Heights, MI (US); Jonathan O. Conell, Sterling Heights, MI (US); Robert A. De Stefano, Macomb, MI (US); Saad Hasan, Detroit, MI (US); Benjamin G. Wroblewski, Ferndale, MI (US); Lyall K. Winger, Waterloo (CA)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 342 days.

(21) Appl. No.: 16/183,895

(22) Filed: Nov. 8, 2018

(65) Prior Publication Data

US 2020/0150182 A1 May 14, 2020

(51) Int. Cl.
*G01R 31/327* (2006.01)
*G01R 35/00* (2006.01)
*G01R 31/00* (2006.01)
*B60L 58/21* (2019.01)
*B60K 6/28* (2007.10)

(52) U.S. Cl.
CPC ........ *G01R 31/3277* (2013.01); *B60L 58/21* (2019.02); *G01R 31/006* (2013.01); *G01R 35/005* (2013.01); *B60K 6/28* (2013.01); *B60L 2240/547* (2013.01); *B60L 2240/549* (2013.01); *B60Y 2200/91* (2013.01); *B60Y 2200/92* (2013.01)

(58) Field of Classification Search
CPC ............. G01R 31/3277; G01R 35/005; G01R 31/006; B60L 58/21; B60L 2240/549; B60L 2240/547; B60L 2250/16; B60L 2240/80; B60L 3/12; B60L 3/0023; B60Y 2200/92; B60Y 2200/91; B60K 6/28
See application file for complete search history.

(56) References Cited

U.S. PATENT DOCUMENTS 7,795,552 B2    9/2010   Maruyama et al.
8,378,767 B2    2/2013   Okubo et al.
(Continued)

FOREIGN PATENT DOCUMENTS

WO   WO-2006064558 A1   6/2006
WO   WO-2011021331 A1   2/2011

*Primary Examiner* — Carlos Amaya
(74) *Attorney, Agent, or Firm* — Harness, Dickey & Pierce, P.L.C.

(57) ABSTRACT

A battery control system includes T contactor paths connected in parallel between a battery and a load, where T is an integer greater than one. Each of the T contactor paths includes a first contactor and a second contactor connected in series with the first contactor. Each of the T contactor paths includes at least one of a first voltage sensor configured to sense a first voltage between the first contactor and the second contactor; and a current sensor configured to sense current flowing through the first contactor and the second contactor. A second voltage sensor is configured to sense a second voltage at one end of the T contactor paths. A third voltage sensor is configured to sense a third voltage at an opposite end of the T contactor paths.

20 Claims, 7 Drawing Sheets

(56) References Cited

U.S. PATENT DOCUMENTS

| | | |
|---|---|---|
| 2007/0216434 A1 | 9/2007 | Korson et al. |
| 2015/0200559 A1* | 7/2015 | Im .......................... H02J 7/0029 307/18 |
| 2019/0210481 A1* | 7/2019 | Ishida ..................... B60L 53/22 |

* cited by examiner

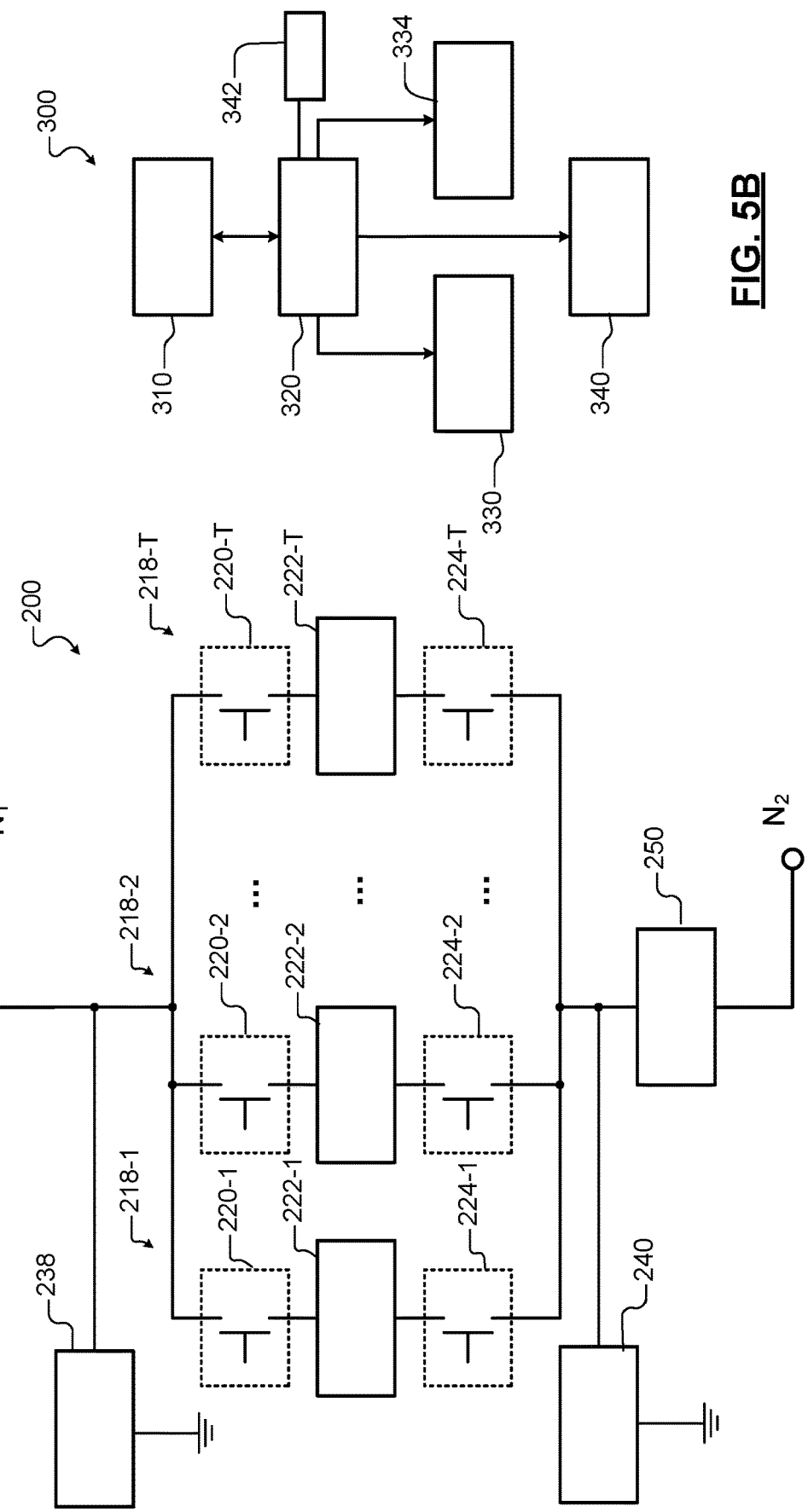

VERIFYING OPERATION OF BATTERY CONTACTORS DURING VEHICLE OPERATION WITHOUT LOSS OF POWER

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to battery systems including contactors and more particularly to systems and methods for verifying operation of and reconfiguring the contactors during operation of a vehicle.

Vehicles such as engine powered vehicles, hybrid vehicles and electric vehicles include battery systems including battery cells. During some modes of operation, the battery cells supply current to loads of the vehicle. For example, the battery cells may supply power for starting an engine, or powering an electric motor in the hybrid vehicle or the electric vehicle. The battery systems typically include a contactor to selectively connect and disconnect the battery from the load.

SUMMARY

A battery control system includes T contactor paths connected in parallel between a battery and a load, where T is an integer greater than one. Each of the T contactor paths includes a first contactor and a second contactor connected in series with the first contactor. Each of the T contactor paths includes at least one of a first voltage sensor configured to sense a first voltage between the first contactor and the second contactor; and a current sensor configured to sense current flowing through the first contactor and the second contactor. A second voltage sensor is configured to sense a second voltage at one end of the T contactor paths. A third voltage sensor is configured to sense a third voltage at an opposite end of the T contactor paths.

In other features, a battery system includes the battery control system and the battery. The battery includes a plurality of battery cells.

In other features, a controller is configured to, during operation of a vehicle including the battery, test each of the T contactor paths by selectively opening one of the first contactor and the second contactor while the other of the first contactor and the second contactor is closed; sensing the second voltage, the third voltage and at least one of the first voltage and the current for the one of the first contactor and the second contactor; and determining an operational state of the one of the first contactor and the second contactor based on the second voltage, the third voltage and at least one of the first voltage and the current.

The controller is further configured to selectively open the other of the first contactor and the second contactor while the one of the first contactor and the second contactor is closed; sense the second voltage, the third voltage and the at least one of the first voltage and the current for the other of the first contactor and the second contactor; and determine an operational state of the other of the first contactor and the second contactor based on the second voltage, the third voltage and the at least one of the first voltage and the current.

In other features, the controller is further configured to, if a state of one of the T contactor paths is not operational, open at least one of the first contactor and the second contactor in the one of the T contactor paths and use operational ones of the T contactor paths to supply power from the battery.

In other features, the controller is configured to operate the vehicle in a restricted power mode if a state of at least one of the T contactor paths is not operational.

In other features, the controller is further configured to generate an error code or trigger an indicator if a state of one of the T contactor paths is not operational.

In other features, a controller is configured to control opening and closing of the first contactor and the second contactor in each of the T contactor paths and to reconfigure usage of the T contactor paths while a vehicle including the battery is operating.

In other features, a controller is configured to control states of the first contactor and the second contactor in each of the T contactor paths. The controller is configured to vary a selected one of the T contactor paths that closes first before other ones of the T contactor paths close.

A battery control system includes T contactor paths connected in parallel between a battery and a load, where T is an integer greater than one. Each of the T contactor paths includes a first contactor; a second contactor connected in series with the first contactor; and a current sensor configured to sense current flowing through the first contactor and the second contactor. A first voltage sensor is configured to sense a first voltage at one end of the T contactor paths. A second voltage sensor is configured to sense a second voltage at an opposite end of the T contactor paths. A controller is configured to control states of the first contactor and the second contactor in each of the T contactor paths; during operation of a vehicle including the battery, test each of the T contactor paths; and if a state of one of the T contactor paths is not operational, open at least one of the first contactor and the second contactor in the one of the T contactor paths and use operational ones of the T contactor paths to supply power from the battery.

In other features, a battery system includes the battery control system and the battery. The battery includes a plurality of battery cells.

In other features, the controller tests each of the T contactor paths by: selectively opening one of the first contactor and the second contactor; sensing the first voltage, the current and the second voltage for the one of the first contactor and the second contactor; and determining an operational state of the one of the first contactor and the second contactor based on the first voltage, the second voltage and the current.

In other features, the controller is further configured to: selectively open the other of the first contactor and the second contactor; sense the first voltage, the current and the second voltage for the other of the first contactor and the second contactor; and determine an operational state of the other of the first contactor and the second contactor based on the first voltage, the second voltage and the current.

In other features, the controller is configured to operate the vehicle in a restricted power mode if a state of at least one of the T contactor paths is not operational. The controller is further configured to generate an error code or trigger an indicator if a state of one of the T contactor paths is not operational.

In other features, the controller is further configured to reconfigure usage of the T contactor paths while a vehicle including the battery is operating. The controller is configured to vary a selected one of the T contactor paths that closes first before other ones of the T contactor paths close.

A battery control system includes T contactor paths connected in parallel between a battery and a load, where T is an integer greater than one. Each of the T contactor paths includes a first contactor; a second contactor connected in series with the first contactor; and a current sensor configured to sense current flowing through the first contactor and the second contactor. A first voltage sensor is configured to sense a first voltage at one end of the T contactor paths. A second voltage sensor is configured to sense a second voltage at an opposite end of the T contactor paths. A controller is configured to control states of the first contactor and the second contactor in each of the T contactor paths; and vary a selected one of the T contactor paths that closes first before other ones of the T contactor paths close.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 5A and 5B are functional block diagrams of an example of a battery system including multiple contactor paths according to the present disclosure;

In the drawings, reference numbers may be reused to identify similar and/or identical elements.

DETAILED DESCRIPTION

While the systems and methods described herein are illustrated in the context of a battery system including multiple contactor paths for a vehicle, the systems and methods descried herein can be used in a number of other vehicle and/or non-vehicle applications. For example, the systems and methods can be used to deliver current from other power sources. In other examples, the systems and methods described herein can be used to deliver current in standby power systems and the like.

Most battery systems include a single contactor connecting one or more loads to the battery. Suitable operation of the contactor is verified periodically to ensure safe battery operation. Traditional systems and methods for testing the contactor perform verification during very low current or off states. In addition, traditional systems and methods for controlling the contactor determine whether the contactor is in good or bad operating condition. These systems and methods do not enable on-the-fly reconfiguration of the battery system to allow continued vehicle operation.

However, verification of operation at low current does not sufficiently guarantee that the contactor will function correctly at higher current levels encountered during vehicle operation. Systems and methods according to the present disclosure relate to a battery system with a plurality of parallel contactor paths that can be reconfigured on-the-fly if/when a contactor failure occurs. The systems and methods also perform testing during operation of the vehicle (such as during driving) to ensure proper operation at higher current levels.

Figure 1:
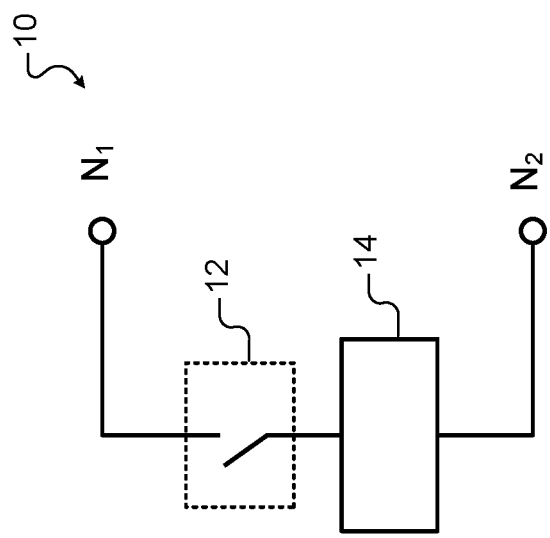

Referring now to FIGS. 1 to 4, examples of battery systems including one or more contactors are shown. In FIG. 1, a system 10 includes an electromechanical contactor 12 and a battery 14 connected between nodes $N_1$ and $N_2$. The battery 14 includes a plurality of battery cells connected in series and/or parallel. Node $N_1$ may be connected to one or more loads and node $N_2$ may be connected to a reference potential such as chassis ground. When a vehicle includes a single battery, power is lost during self-testing of the electromechanical contactor 12. Therefore, the self-testing cannot be performed while the vehicle is in operation. This approach also does not test operation of the contactor at high current levels.

Figure 2:
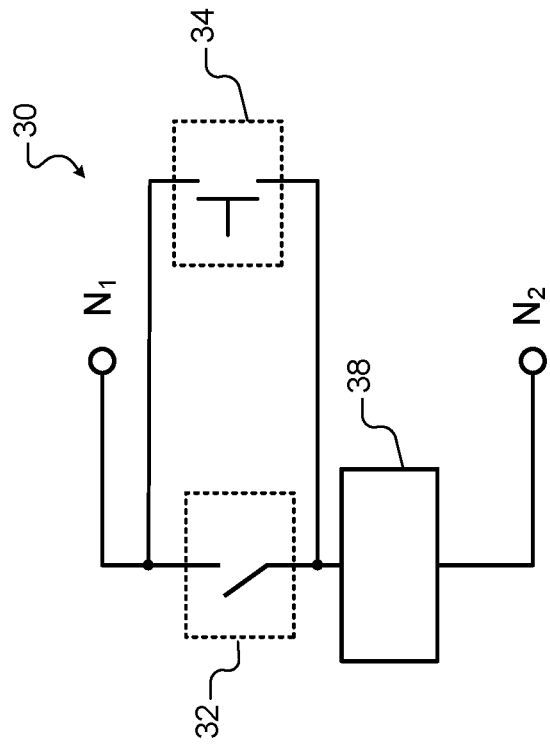
FIGS. 1 to 4 are functional block diagrams of examples of battery systems including contactors.

In FIG. 2, a system 30 includes an electromechanical contactor 32 and a battery 38 connected between nodes $N_1$ and $N_2$. One terminal of a relay 34 is connected to the node $N_1$ and another terminal of the relay 34 is connected between the electromechanical contactor 32 and the battery 38. In some examples, the relay 34 includes a field effect transistor (FET) operating as a switch. The path including the relay 34 can only handle a limited amount of power. Therefore, the vehicle must be maintained in a low-power or quiescent state during testing. The low-power or quiescent state must be planned at the vehicle control system level. Currently, many manufacturers do not have a way of synchronizing or preventing module wake ups during the contactor self-testing. Therefore, the low-power or quiescent state is not guaranteed during testing.

Figure 3:
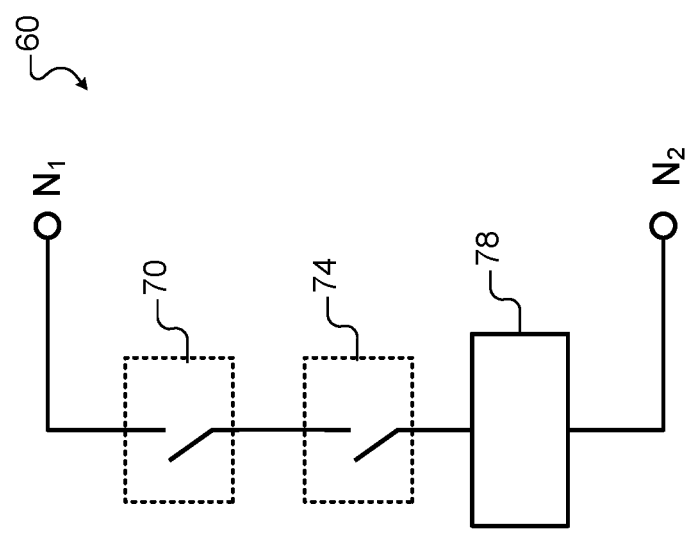

In FIG. 3, a system 60 includes first and second electromechanical contactors 70 and 74 that are connected in series between nodes $N_1$ and $N_2$. A battery 78 is connected to the first and second contactors 70 and 74. The second electromechanical contactor 74 ensures that the battery 78 can be disconnected from the node $N_1$. When a vehicle includes a single battery, power is lost during self-testing of the first contactor 70 and/or the second contactor 74. Therefore, the self-testing cannot be performed while the vehicle is in operation, which is somewhat impractical.

Figure 4:
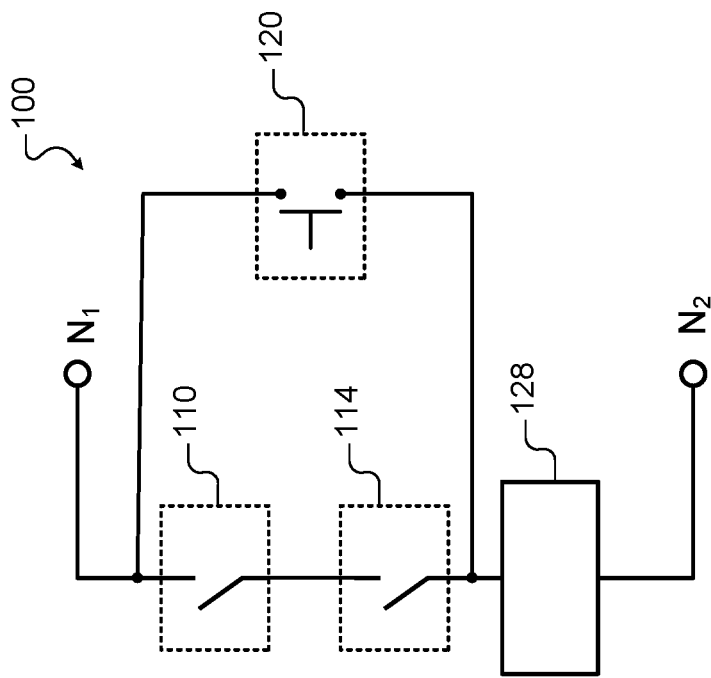

In FIG. 4, a system 100 includes first and second electromechanical contactors 110 and 114 connected in series between nodes $N_1$ and $N_2$. A battery 128 is connected to the first and second electro-mechanical contactors 110 and 114. One terminal of a relay 120 is connected to the node $N_1$ and another terminal of the relay 120 is connected between the second electromechanical contactor 114 and the battery 128. In some examples, the relay 120 includes a field effect transistor (FET) switch.

The path including the relay 120 can only handle a limited amount of power. Therefore, the vehicle must be maintained in a low-power or quiescent state during testing. The low-power or quiescent state must be planned at the vehicle control system level. Currently, many manufacturers do not have a way of synchronizing or preventing module wake ups during the contactor self-testing. Therefore, the low-power or quiescent state is not guaranteed.

Figure 6:
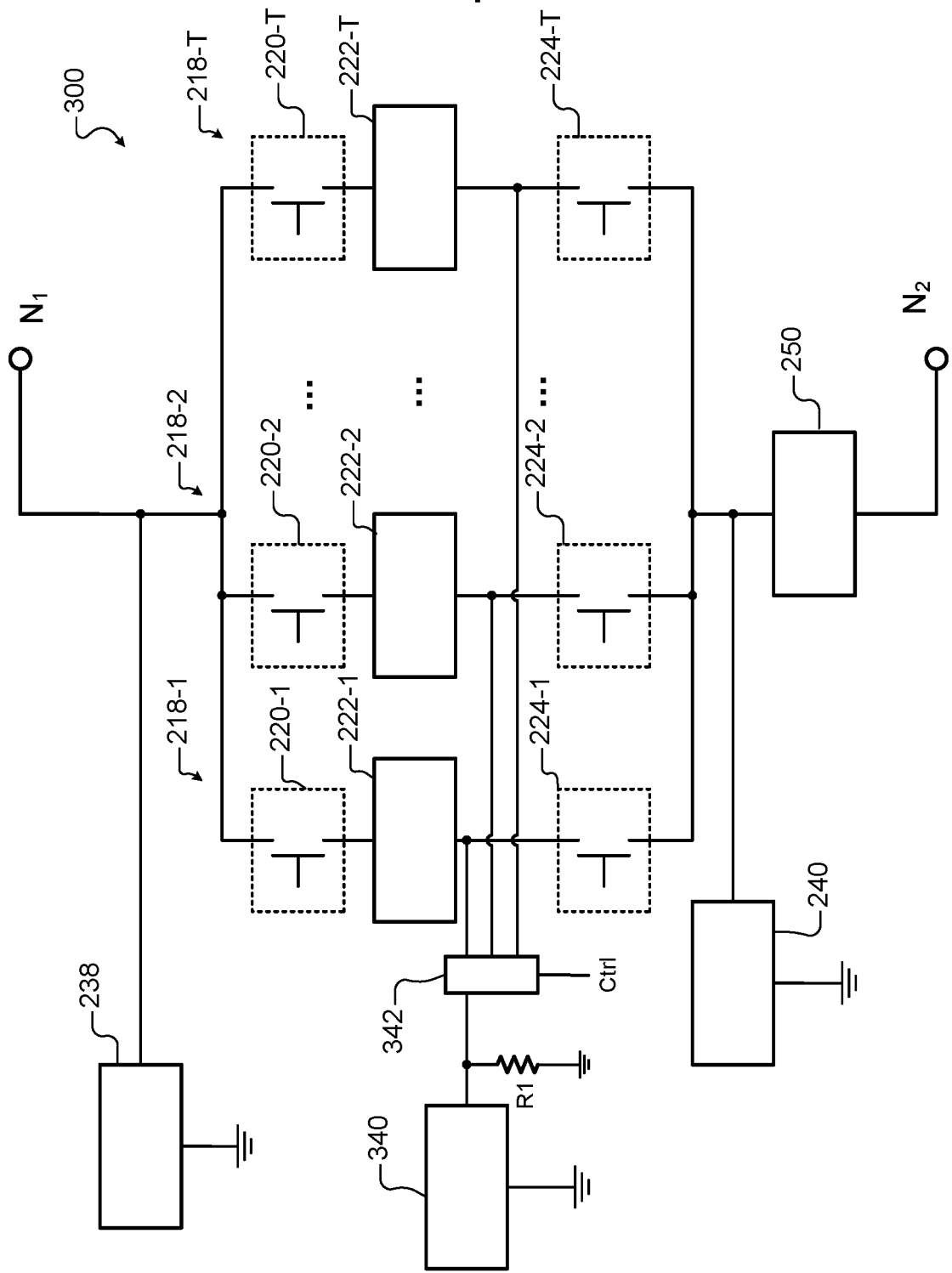
FIG. 6 is a functional block diagram of an example of a battery system including multiple contactor paths according to the present disclosure.

Referring now to FIGS. 5A to 6, a battery system 200 according to the present disclosure is shown. The battery system 200 includes a plurality of contactor paths 218-1, 218-2, ..., and 218-T (collectively contactor paths 218) (where T is an integer greater than one) that are connected in parallel. Each of the contactor paths 218 includes a first contactor (e.g. first contactors 220-1, 220-2, ..., and 220-T (collectively first contactors 220)), a current sensor (current sensors 222-1, 222-2, ..., and 222-T (collectively current sensors 222)), and a second contactor (e.g. second contactors 224-1, 224-2, ..., and 224-T (collectively second contactors 224)). The first and second contactors 220 and 224 include first and second terminals and a control terminal. The additional contactor paths reduce the current carried by each contactor path, which will increase the lifetime of the contactors in each path.

The current sensors 222 sense current flowing in each of the contactor paths 218. A first voltage sensor 238 senses a first voltage between the contactors 220 and the node $N_1$. A second voltage sensor 240 senses a second voltage between the second contactors 224 and the battery 250. The first contactors 220 and the second contactors 224 may be electromechanical contactors or electrical switches such as FETs.

In FIG. 5B, a battery control system 300 includes one or more vehicle controllers 310 that communicate with a battery system controller 320. The battery system controller 320 communicates with the voltage sensors 330 and the current sensors 334. The controller 320 performs testing and selectively reconfigures the contactors 340 based upon the sensed voltages and currents as will be described further below. In some examples the one or more vehicle controllers 310 determine when to perform testing. In other examples, the controller 320 determines when to perform testing.

In FIG. 6, another example of a battery system 300 according to the present disclosure is shown. One or more voltage sensors 330 are connected between the contactors 220 and 224 in the T contactor paths 218 to sense voltage between the contactors 220 and 224. In some examples, the current sensors 222 can be omitted and voltage sensing is used to diagnose operation. In some examples, the current sensors are calibrated for zero offset when one or both of the contactors in the corresponding path are opened.

One or more resistors R1 are optionally connected to ground to eliminate stray charge between the contactors 220 and 224 (when one or both are open) and to increase the signal-to-noise (S/N) ratio of the voltage delta readings. For example, resistors having a value greater than or equal to 1 mΩ may be used. While each conductor path may include a separate voltage sensor, a multiplexer 342 may be used to reduce cost by eliminating T-1 of the voltage sensors 340 and to selectively connect the voltage sensor 340 to the correct one of the T conductor paths 218 for measurement.

The controller 320 can enable or disable each of the contactors in each of the contactor paths. The contactors are sized to enable supporting loads with one or more of the contactor paths opened. When the first contactor and/or the second contactor in a contactor path are operational and open, the current measured by the current sensor drops to zero and the voltage sensors will read a voltage difference between the external voltage and the battery voltage. If one of the contactors has failed closed, the voltage difference will be lower or approximately zero and the sensed current will be greater than zero.

If the first or second contactor of the contactor path fails closed, the second or first contactor in the same contactor path can be opened. In some examples, the opening of the operational contactor in the contactor path can be verified to allow continued vehicle operation. The vehicle continues to operate using the remaining contactor paths. If both the first and second contactors in a contactor path failed closed, then operation of the vehicle may be prevented.

Figure 7:
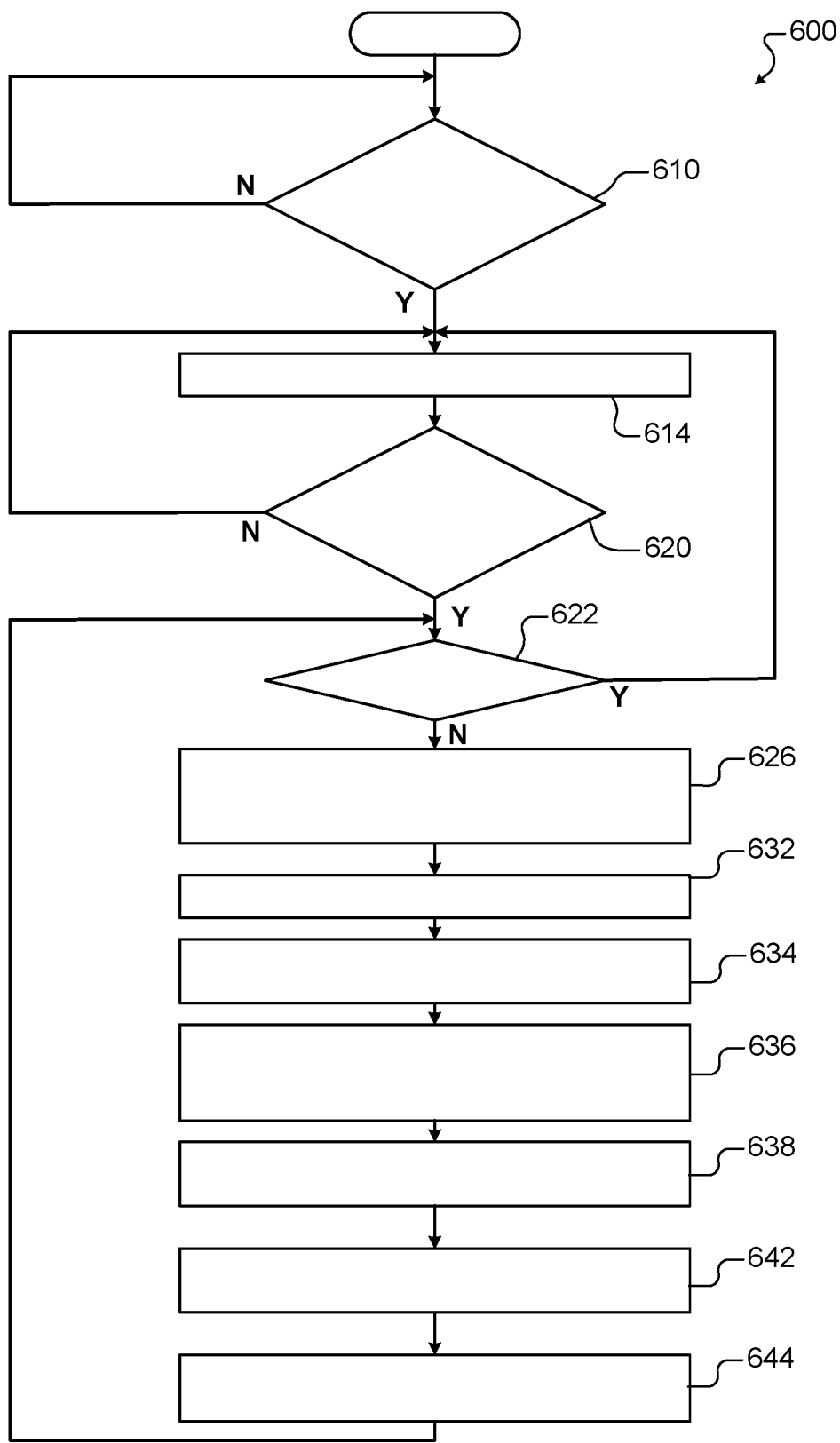
FIG. 7 is a flowchart of an example of a method for operating the battery system including multiple contactor paths according to the present disclosure.

Referring now to FIG. 7, a method 600 for operating the battery system including multiple parallel contactor paths is shown. At 610, the method determines whether the vehicle is operating. Generally, when the vehicle is operating, the contactors in one or more of the N contactor paths are closed to supply a vehicle load. When 610 is true, the method sets N=1 at 614. At 620, the method determines whether a predetermined period is up or an event occurs to trigger testing. For example, testing can be performed every D drive cycles (where D is an integer greater than zero). In other examples, measured current and voltage values from preceding tests may be used to determine future testing frequency. In other examples, testing may be performed after H high load events such as a hard acceleration, where H is an integer greater than zero.

If 620 is true, the method continues at 622 and determines whether N>T where T corresponds to the number of contactor paths T. At 626, the method opens one contactor in the $N^{th}$ contactor path while the other contactor in the $N^{th}$ contactor path is closed. At 632, the method samples and stores the first and second voltages and the sensed current. At 634, the method determines an operational state of the contactor in the $N^{th}$ contactor path based on the first and second voltages and the measured current. In some examples, the first and second voltages and the measured current can be compared to predetermined voltage and current values.

If the one contactor is operational, the other contactor is tested. At 636, the method opens the other contactor in the $N^{th}$ contactor path while the one contactor in the $N^{th}$ contactor path is closed. At 638, the method samples and stores the voltages and the current. At 642, the method determines an operational state of the other contactor in the $N^{th}$ contactor path. At 644, the method increments N, closes the contactors in the $N^{th}$ contactor path and returns to 622 to test the remaining contactor paths. As can be appreciated, the number of contactors in each of the contactor paths can be varied.

Figure 8:
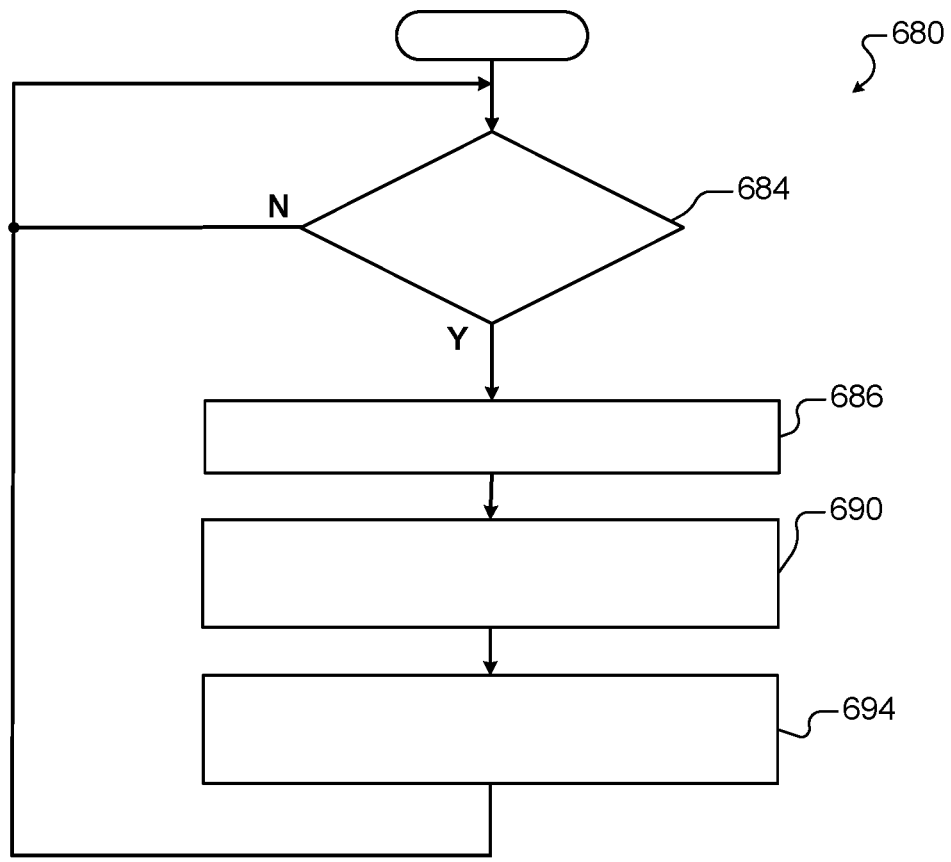
FIG. 8 is a flowchart of an example of a method for operating the battery system including multiple contactor paths according to the present disclosure.

Referring now to FIG. 8, a method 680 for operating the battery system including multiple contactor paths is shown. At 684, the method determines whether one of the contactor paths is not operational as determined in FIG. 7. At 686, the method operates the vehicle using one or more of the remaining operational contactor paths. In other words, one or both of the contactors in the non-operational path are opened. At 690, the method optionally generates an error code and/or triggers an indicator based upon the number of remaining operational contactor paths. For example, a battery system including 3 contactor paths may be allowed to operate with 2 operational contactor paths without generating an error code or triggering an indicator. However, when another one of the remaining 2 contactor paths is faulty, the error code and/or indicator are used. In other examples, the error code or indicator may be triggered if only one contactor path is not working. At 694, the method optionally operates the vehicle in a restricted power mode depending upon the number of remaining operational contactor paths.

Figure 9:
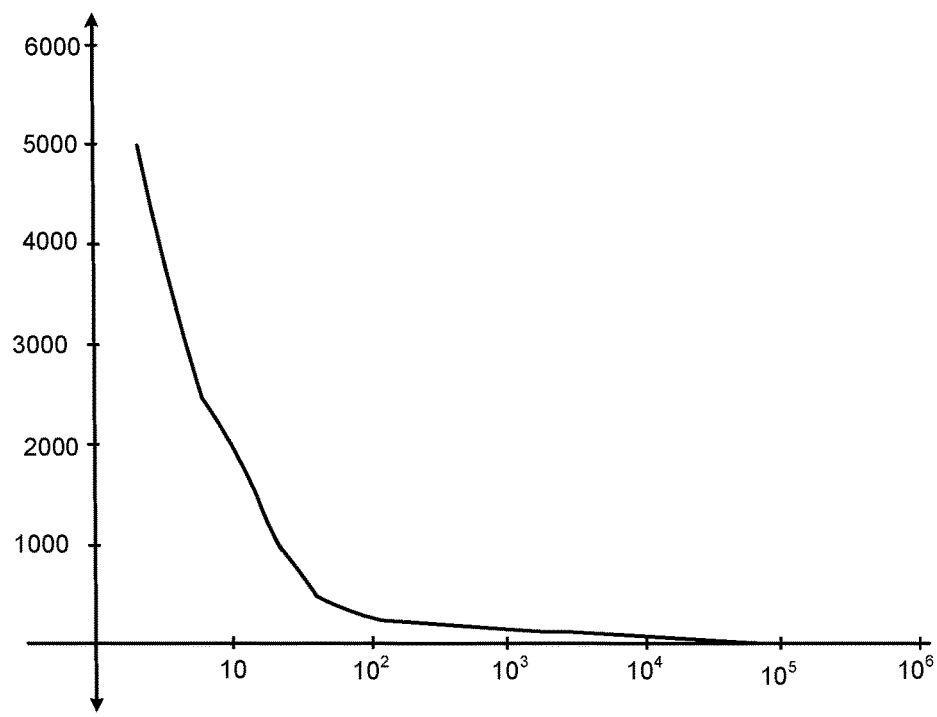
FIG. 9 is a graph illustrating a number of expected operating cycles of the contactors at different switching current levels.

Referring now to FIG. 9, a number of expected operating cycles at different current levels is shown. As can be appreciated, as the switching current decreases, the number of switching operations that can be performed by the contactor before failure increases significantly. Systems and methods according to the present disclosure change a selected one of the contactor paths that closes first to even the wear on all of the contactor paths.

Figure 10:
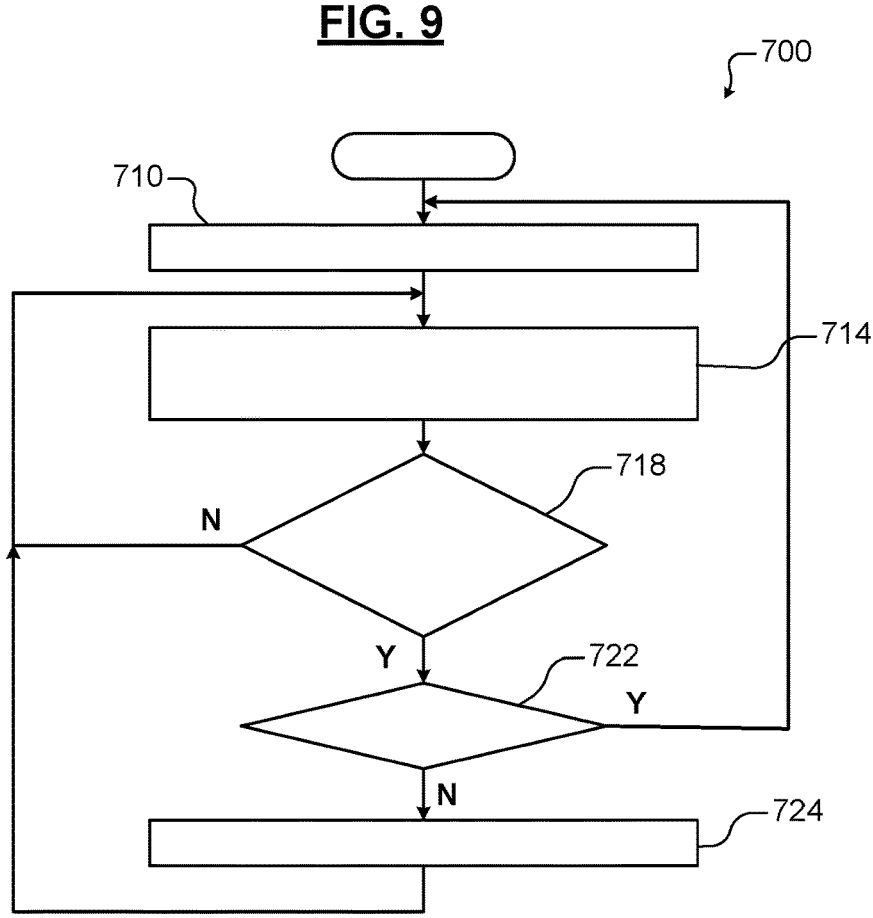
FIG. 10 is a flowchart of an example of a method for operating the battery system including multiple contactor paths according to the present disclosure.

Referring now to FIG. 10, a method 700 for operating the battery system including multiple contactor paths is shown. At 710, the method sets N=1. At 714, the method selects and uses the $N^{th}$ one of the plurality of contactor paths as the first contactor path to be closed during operation. At 718, method determines whether a predetermined period is up or an event occurs. For example, the predetermined event may include V vehicle power on events, where V is an integer greater than zero. If 718 is true, the method determines whether N=T. If 722 is false, the method increments N at 724 and returns to 714. If 722 is true, the method returns to 710.

These systems and methods described herein can detect contactor failures during vehicle operation without loss of or limitation to the power of the vehicle's electrical system. The battery system can be reconfigured to remove a failing contactor to enable the vehicle to keep running and potentially fault-tolerant and operational despite the failure. These systems and methods described herein also significantly extend the life of the contactors when they are forced to open/close with high current. The testing of the contactors can be performed without synchronization to vehicle operation. The systems and methods described herein can also detect current offsets and/or other hardware or calibration issues.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A battery control system comprising:
   T contactor paths connected in parallel between a battery and a load, where T is an integer greater than one, wherein each of the T contactor paths includes:
   a first contactor;
   a second contactor connected in series with the first contactor; and
   at least one of:
      a first voltage sensor configured to sense a first voltage between the first contactor and the second contactor; and
      a current sensor configured to sense current flowing through the first contactor and the second contactor;
   a second voltage sensor configured to sense a second voltage at one end of the T contactor paths; and
   a third voltage sensor configured to sense a third voltage at an opposite end of the T contactor paths.

2. A battery system comprising:
   the battery control system of claim 1; and
   the battery, wherein the battery includes a plurality of battery cells.

3. The battery control system of claim 1, further comprising:
   a controller configured to, during operation of a vehicle including the battery, test each of the T contactor paths by:
      selectively opening one of the first contactor and the second contactor while the other of the first contactor and the second contactor is closed;
      sensing the second voltage, the third voltage and at least one of the first voltage and the current for the one of the first contactor and the second contactor; and
      determining an operational state of the one of the first contactor and the second contactor based on the second voltage, the third voltage and at least one of the first voltage and the current.

4. The battery control system of claim 3, wherein the controller is further configured to:
   selectively open the other of the first contactor and the second contactor while the one of the first contactor and the second contactor is closed;
   sense the second voltage, the third voltage and the at least one of the first voltage and the current for the other of the first contactor and the second contactor; and
   determine an operational state of the other of the first contactor and the second contactor based on the second voltage, the third voltage and the at least one of the first voltage and the current.

5. The battery control system of claim 3, wherein the controller is further configured to, if a state of one of the T contactor paths is not operational, open at least one of the first contactor and the second contactor in the one of the T contactor paths and use operational ones of the T contactor paths to supply power from the battery.

6. The battery control system of claim 3, wherein the controller is configured to operate the vehicle in a restricted power mode if a state of at least one of the T contactor paths is not operational.

7. The battery control system of claim 3, wherein the controller is further configured to generate an error code or trigger an indicator if a state of one of the T contactor paths is not operational.

8. The battery control system of claim 1, further comprising a controller configured to control opening and closing of the first contactor and the second contactor in each of the T contactor paths and to reconfigure usage of the T contactor paths while a vehicle including the battery is operating.

9. The battery control system of claim 1, further comprising a controller configured to:
   control states of the first contactor and the second contactor in each of the T contactor paths; and
   vary a selected one of the T contactor paths that closes first before other ones of the T contactor paths close.

10. The battery control system of claim 3, wherein the controller is further configured to calibrate zero offset of the current sensor in at least one of the T contactor paths when at least one of the first contactor and the second contactor of the at least one of the T contactor paths is open.

11. A battery control system comprising:
    T contactor paths connected in parallel between a battery and a load, where T is an integer greater than one, wherein each of the T contactor paths includes:
    a first contactor;
    a second contactor connected in series with the first contactor; and
    a current sensor configured to sense current flowing through the first contactor and the second contactor; and
    a first voltage sensor configured to sense a first voltage at one end of the T contactor paths;

a second voltage sensor configured to sense a second voltage at an opposite end of the T contactor paths; and
a controller configured to:
control states of the first contactor and the second contactor in each of the T contactor paths;
during operation of a vehicle including the battery, test each of the T contactor paths; and
if a state of one of the T contactor paths is not operational, open at least one of the first contactor and the second contactor in the one of the T contactor paths and use operational ones of the T contactor paths to supply power from the battery.

12. A battery system comprising:
the battery control system of claim 11; and
the battery, wherein the battery includes a plurality of battery cells.

13. The battery control system of claim 11, wherein the controller tests each of the T contactor paths by:
selectively opening one of the first contactor and the second contactor;
sensing the first voltage, the current and the second voltage for the one of the first contactor and the second contactor; and
determining an operational state of the one of the first contactor and the second contactor based on the first voltage, the second voltage and the current.

14. The battery control system of claim 13, wherein the controller is further configured to:
selectively open the other of the first contactor and the second contactor;
sense the first voltage, the current and the second voltage for the other of the first contactor and the second contactor; and
determine an operational state of the other of the first contactor and the second contactor based on the first voltage, the second voltage and the current.

15. The battery control system of claim 11, wherein the controller is configured to operate the vehicle in a restricted power mode if a state of at least one of the T contactor paths is not operational.

16. The battery control system of claim 11, wherein the controller is further configured to generate an error code or trigger an indicator if a state of one of the T contactor paths is not operational.

17. The battery control system of claim 11, wherein the controller is further configured to reconfigure usage of the T contactor paths while the vehicle including the battery is operating.

18. The battery control system of claim 11, wherein the controller is configured to vary a selected one of the T contactor paths that closes first before other ones of the T contactor paths close.

19. A battery control system comprising:
T contactor paths connected in parallel between a battery and a load, where T is an integer greater than one, wherein each of the T contactor paths includes:
a first contactor;
a second contactor connected in series with the first contactor; and
a current sensor configured to sense current flowing through the first contactor and the second contactor;
a first voltage sensor configured to sense a first voltage at one end of the T contactor paths;
a second voltage sensor configured to sense a second voltage at an opposite end of the T contactor paths; and
a controller configured to:
control states of the first contactor and the second contactor in each of the T contactor paths; and
vary a selected one of the T contactor paths that closes first before other ones of the T contactor paths close.

20. The battery control system of claim 1, wherein the T contactor paths are connected in parallel between a terminal of the battery and a terminal of the load.

* * * * *